(12) United States Patent
Ono et al.

(10) Patent No.: US 7,709,353 B2
(45) Date of Patent: May 4, 2010

(54) METHOD FOR PRODUCING SEMICONDUCTOR DEVICE

(75) Inventors: Hideki Ono, Tokyo (JP); Satoshi Taniguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 76 days.

(21) Appl. No.: 11/893,458

(22) Filed: Aug. 16, 2007

(65) Prior Publication Data

US 2008/0050858 A1 Feb. 28, 2008

(30) Foreign Application Priority Data

Aug. 22, 2006 (JP) ............................ P2006-224845

(51) Int. Cl.
*H01L 21/46* (2006.01)
(52) U.S. Cl. .................... 438/458; 438/745; 438/754; 438/977
(58) Field of Classification Search .................. None
See application file for complete search history.

(56) References Cited

U.S. PATENT DOCUMENTS

| | | | | |
|---|---|---|---|---|
| 6,858,518 B2 * | 2/2005 | Kondo | ........................ | 438/458 |
| 6,943,050 B2 * | 9/2005 | Kondo | ........................ | 438/46 |
| 6,983,092 B2 * | 1/2006 | Kondo | ........................ | 385/49 |
| 7,050,664 B2 * | 5/2006 | Kondo | ........................ | 385/14 |
| 7,092,588 B2 * | 8/2006 | Kondo | ........................ | 385/14 |
| 7,109,534 B2 * | 9/2006 | Kondo | ........................ | 257/197 |
| 7,151,313 B2 * | 12/2006 | Kondo | ........................ | 257/741 |
| 7,212,711 B2 * | 5/2007 | Kondo | ........................ | 385/49 |
| 7,228,018 B2 * | 6/2007 | Kondo | ........................ | 385/14 |
| 7,244,662 B2 * | 7/2007 | Kondo | ........................ | 438/458 |
| 7,251,385 B2 * | 7/2007 | Kondo | ........................ | 385/14 |
| 7,286,586 B2 * | 10/2007 | Kondo | ................... | 372/50.21 |
| 7,306,963 B2 * | 12/2007 | Linden | ........................ | 438/40 |
| 7,448,233 B2 * | 11/2008 | Takakuwa et al. | ............. | 65/386 |
| 2003/0170946 A1 * | 9/2003 | Kondo | ........................ | 438/200 |
| 2003/0170965 A1 * | 9/2003 | Kondo | ........................ | 438/455 |
| 2004/0007709 A1 * | 1/2004 | Kondo | ........................ | 257/80 |

(Continued)

FOREIGN PATENT DOCUMENTS

JP 06-338563 12/1994

(Continued)

OTHER PUBLICATIONS

Schemer et al., "Epitaxial Lift-Off for Large Area Thin Film III/V Devices", Experimental Solid State Physics III, 202, No. 4, 2005, pp. 501-508.

(Continued)

*Primary Examiner*—David E Graybill
(74) *Attorney, Agent, or Firm*—Robert J. Depke; Rockey, Depke & Lyons, LLC.

(57) ABSTRACT

A method for producing a semiconductor device includes the steps of forming a predetermined device in a device layer grown on a semiconductor substrate with a sacrificial layer provided therebetween; and removing the sacrificial layer by etching to separate the semiconductor substrate from the device layer while a supporting substrate is bonded to the side of the device layer, wherein in the step of removing the sacrificial layer, a groove extending from the device layer to the sacrificial layer is formed before the sacrificial layer is removed, and the etching solution is allowed to penetrate to the sacrificial layer through the groove.

10 Claims, 14 Drawing Sheets

U.S. PATENT DOCUMENTS

| | | | |
|---|---|---|---|
| 2004/0036078 A1* | 2/2004 | Kondo | 257/80 |
| 2004/0048447 A1* | 3/2004 | Kondo | 438/458 |
| 2004/0131304 A1* | 7/2004 | Kondo | 385/14 |
| 2004/0136639 A1* | 7/2004 | Kondo | 385/14 |
| 2004/0136715 A1* | 7/2004 | Kondo | 398/82 |
| 2004/0184495 A1* | 9/2004 | Kondo | 372/36 |
| 2004/0218874 A1* | 11/2004 | Kondo | 385/88 |
| 2004/0228579 A1* | 11/2004 | Kondo | 385/49 |
| 2004/0253782 A1* | 12/2004 | Kondo | 438/222 |
| 2004/0264867 A1* | 12/2004 | Kondo | 385/49 |
| 2005/0016217 A1* | 1/2005 | Takakuwa et al. | 65/386 |
| 2005/0082643 A1* | 4/2005 | Kondo | 257/620 |
| 2005/0098775 A1* | 5/2005 | Kondo | 257/40 |
| 2006/0115917 A1* | 6/2006 | Linden | 438/46 |
| 2006/0270238 A1* | 11/2006 | Izumi et al. | 438/700 |
| 2007/0017630 A1* | 1/2007 | Kirby et al. | 156/250 |

FOREIGN PATENT DOCUMENTS

| | | |
|---|---|---|
| JP | 09-186240 | 7/1997 |
| JP | 2001-102668 | 4/2001 |
| JP | 2002-231731 | 8/2002 |
| JP | 2003-203898 | 7/2003 |
| JP | 2005-012034 | 1/2005 |

OTHER PUBLICATIONS

Morf, et al., "RF and 1/F Noise Investigations on MESFETS and Circuits Transplanted by Epitaxial Lift Off", IEEE Transactions of Electron Devices, vol. 43, No. 9, Sep. 1996, pp. 1489-1494.

Yablonovitch et al., "Van der Waals Bonding of GaAs Epitaxial Liftoff Films Onto Arbitrary Substrates", Appl. Phys. Lett. 56, No. 24, pp. 2419-2421, Jun. 11, 1990.

Rodwell et al., "Submicron Scaling of HBTs", IEEE Electron Devices, vol. 48, Nov. 2001, pp. 2606-2624.

Lee et al., "Submicron Transferred-Substrate Heterojuction Bipolar Transistors", IEEE Electron Device Letters, vol. 20, No. 8, Aug. 1999. pp. 396-398.

* cited by examiner

VIEW WHEN VIEWED FROM SURFACE OF SUBSTRATE

VIEW WHEN VIEWED FROM SURFACE OF SUBSTRATE

METHOD FOR PRODUCING SEMICONDUCTOR DEVICE

CROSS REFERENCES TO RELATED APPLICATIONS

The present invention contains subject matter related to Japanese Patent Application JP 2006-224845 filed in the Japanese Patent Office on Aug. 22, 2006, the entire contents of which are incorporated herein by reference.

BACKGROUND OF THE INVENTION

1. Field of the Invention

The present invention relates to a method for producing a semiconductor device by growing a device layer on a semiconductor substrate, forming a predetermined device in the device layer, and separating the device layer from the semiconductor substrate.

2. Description of the Related Art

Hitherto, the following devices including compound semiconductor materials and methods for producing the devices have been employed.

High-In-Content Device

Hetero-junction bipolar transistors (HBTs) each including InGaAs lattice-matched grown on an InP substrate and high-electron-mobility transistors (HEMTs) each including InGaAs/InAlAs have a balance between high-speed capability and high electric field strength. Development of HBTs and HEMTs as key devices for large-capacity communication systems has been promoted. However, InP substrates are expensive. This is a factor in limiting InP devices being applied to consumer appliances.

For the purpose of providing high-In-content devices at low cost, metamorphic growth including growing a high-In-content device layer on a buffer layer provided on a GaAs substrate or a Si substrate that is inexpensive compared with an InP substrate has been developed. HEMTs each including metamorphic InGaAs/InAlAs on a GaAs substrate are close to practical use. However, metamorphic HBTs are still not in practical use.

Epitaxial Lift-Off Method

As another method for providing a compound semiconductor device at low cost, there is epitaxial lift-off (ELO). It is desirable to reuse a substrate by ELO. Studies on methods for producing III/V Group semiconductor devices by employing ELO have been conducted. ELO includes forming a sacrificial layer between a device layer and a substrate; immersing the substrate in an appropriate solution after the completion of a production process of a device or before a production process of a device is initiated; and dissolving the sacrificial layer to separate the device layer from the substrate. The separated semiconductor substrate can be reused.

Points of ELO are etching of the sacrificial layer, i.e., to obtain a high etch rate of the sacrificial layer in a lateral direction, and the handling of the ultra-thin device layer, i.e., to transfer the ultra-thin device layer subjected to lift-off onto another substrate without damage to the ultra-thin device layer.

In ELO, the sacrificial layer is dissolved by lateral etching, thus requiring a corresponding time to complete lift-off. An increase in the diameter of the substrate requires a longer time to complete lift-off. For example, it takes several tens of hours to several days for the detachment of a substrate having a diameter of two inches in response to the diameter of a substrate, the material of the sacrificial layer, a thickness, etching conditions, and the like.

An attempt is made to increase the lateral-etching rate (J. J. Schermer et al. "Epitaxial Lift-OFF for large area thin film III/V devices", Phys. Stat. sol. 202, No. 4. (2005), 501-508 (Non-Patent Document 1)). In this case, a flexible supporting substrate is bonded to a device layer and is curled up to open an inlet for an etching solution, thereby significantly increasing the etching rate. As described in Non-Patent Document 1, however, bending the device layer may cause damage to the device layer.

The handling of an ultra-thin device layer having a thickness of several micrometers to several tens of micrometers is reported (T. Morf et al. "RF and 1/F noise investigations on MESFETs and circuit transplanted by Epitaxial Lift OFF". Electron Device 43(1996)1489-1494 (Non-Patent Document 2)). Non-Patent Document 2 describes a simple method utilizing wax as a support. After lift-off, there is provided a method including mounting the device layer on a supporting substrate, such as glass or Si, having a clean surface; and applying an appropriate load to the device layer from the above to bond the device layer to the supporting substrate by intermolecular force (Van der Waals bonding; e.g., see E. Yablonovltch et al. "Van der Waals bonding of GaAs epitaxial liftoff films onto arbitrary substrates", Appl. Phys. Lett. 56(1990)2419-2421 (Non-Patent Document 3)). In this method, disadvantageously, it is difficult to perform a backside process. That is, by appropriately performing the backside process, element characteristics can be improved. However, when wax is used as a support and when the backside process is performed, a plurality of steps of transferring the device layer to substrates are required, thus increasing the risk of damage to the ultra-thin device layer.

Reduction in Thickness of Device Layer

Reducing the thickness of a device layer (semiconductor chip) is a common process performed for the purpose of improving the heat-releasing properties of a chip. In general, after device processing, the backside of a substrate is polished to reduce the thickness to about 100 µm. A metal thin film is formed on the backside. The device layer is subjected to dicing. The resulting chip is mounted on an IC case. In recent years, further progress has been made in a reduction in thickness. A polishing technique in which a device layer is polished so as to have a thickness of about 50 µm and a technique for handling an ultra-thin chip have been developed. Hitherto, the thickness of a chip is reduced by backside polishing. A substrate disappears by polishing. Thus, it is difficult to reuse. The thickness of a device layer obtained by ELO is at most about 10 µm; hence, an ultra-thin chip that may not be obtained by the known polishing technique is obtained.

Backside Process

Performing a backside process after reducing the thickness of a device layer improves characteristics of a HBT including InGaAs/InP (see M. J. W. Rodwell et al. "Submicron Scaling of HBTS", IEEE Electron Devices 48(2001)2606-2624 (Non-Patent Document 4) and Q. Lee et al. "Submicron transferred-substrate heterojunction bipolar transistors", IEEE Electron Device Lett. 20(1999)396-399 (Non-Patent Document 5)). That is, a substrate surface subjected to device processing is bonded to a supporting substrate. An InP substrate is subjected to backside polishing and wet etching. Then collector electrode is formed on the backside. This method is referred to as a "transferred substrate". Thereby, the capacitance between a base and a collector is reduced to obtain a high fmax. In this way, if a lithography process is performed on a backside after reducing the thickness of a device layer, the high-speed capability of a HBT may be improved.

SUMMARY OF THE INVENTION

However, the above-described method for producing a semiconductor device has disadvantages described below. In the production of a device including expensive compound semiconductor, it takes a long time for etching a sacrificial layer by ELO. From the view point, although Non-Patent Document 1 discloses the technique to use the flexible supporting substrate, bending the device layer may cause damage to the device. In Non-Patent Documents 4 and 5, backside processing is difficult to employ. Thus, it is difficult to improve the characteristics of the device.

According to an embodiment of the present invention, there is provided a method for producing a semiconductor device including the steps of forming a predetermined device in a device layer grown on a semiconductor substrate with a sacrificial layer provided therebetween; and removing the sacrificial layer by etching to separate the semiconductor substrate from the device layer while a supporting substrate is bonded to the side of the device layer, wherein in the step of removing the sacrificial layer, a groove extending from the device layer to the sacrificial layer is formed before the sacrificial layer is removed, and the etching solution is allowed to penetrate to the sacrificial layer through the groove.

According to an embodiment of the present invention, the supporting substrate is bonded to the device layer including the device, and the sacrificial layer is removed by etching to separate the device from the semiconductor substrate. The etching solution is allowed to penetrate to the entirety of the sacrificial layer through the groove extending from the device layer to the sacrificial layer. Thereby, the etching solution is surely allowed to penetrate from the middle portion to the periphery of the sacrificial layer, thus rapidly separating the device layer from the semiconductor substrate.

According to an embodiment of the present invention, there is provided a method for producing a semiconductor device including the steps of forming devices corresponding to a plurality of chips in a device layer grown on a semiconductor substrate with a sacrificial layer provided between the device layer and the semiconductor substrate; forming grooves each located between adjacent chips, each of the grooves extending from the device layer to the sacrificial layer; bonding a supporting substrate to the side of the device layer; removing the sacrificial layer by allowing an etching solution to penetrate to the sacrificial layer through the grooves to separate the semiconductor substrate from the device layer; and dividing the supporting substrate into pieces each corresponding to a corresponding one of the plurality of chips to form individual chips.

According to an embodiment of the present invention, the supporting substrate is bonded to the device layer including the devices, and the sacrificial layer is removed by etching to separate the device layer from the semiconductor substrate. The etching solution is allowed to penetrate to the entirety of the sacrificial layer through the grooves each extending from the device layer to the sacrificial layer. Thereby, the etching solution is surely allowed to penetrate from the middle portion to the periphery of the sacrificial layer, thus rapidly separating the device layer from the semiconductor substrate.

In this case, the grooves are in the form of a grid, each of the grooves being located between adjacent chips. Thereby, the etching solution is efficiently allowed to penetrate from the middle portion to the periphery of the sacrificial layer. Furthermore, the grooves are usable as dicing lines when the chips are formed.

With respect to the depth of each groove extending from the device layer to the sacrificial layer, each groove may extend from the device layer to the bottom of the sacrificial layer. Each groove may extend from the device layer to the middle of the thickness of the sacrificial layer. Alternatively, each groove may extend from the device layer to the surface of the sacrificial layer. That is, the penetration of the etching solution through the grooves increases the area in which the sacrificial layer is immersed in the etching solution.

Forming a device-protecting layer between the sacrificial layer and the device layer suppresses damage to the device formed in the device layer when the etching solution is allowed to penetrate through the grooves.

Forming a substrate-protecting film located between the semiconductor substrate and the sacrificial layer suppresses damage to the semiconductor substrate in removing the sacrificial layer by allowing the etching solution to penetrate through the grooves.

According to an embodiment of the present invention, it is particularly effective to use a compound semiconductor substrate such as an InP substrate or a GaAs substrate. The sacrificial layer is preferably composed of AlAs or AlAsSb.

DESCRIPTION OF THE PREFERRED EMBODIMENTS

In a method according to an embodiment for producing a semiconductor device, monolithic microwave IC (MMIC) chips each including a high-In-content device produced by epitaxial lift-off (ELO) are exemplified. The method according to this embodiment for producing the MMIC chips has the following advantages.

1. A device layer is separated from a substrate by ELO to form MMIC chips.
2. Grooves which are in the form of a grid and which are each located between adjacent chips are formed in the device substrate side before the device substrate is bonded to a supporting substrate. The grooves in the form of a grid function as inlets for an etching solution that etches a sacrificial layer during the subsequent ELO step. In the ELO step, the penetration of the etching solution through the grooves results in the rapid completion of etching of the sacrificial layer.
3. The device layer is transferred to the supporting substrate while chip arrangement on the device substrate is maintained.
4. The supporting substrate serves as a heat sink for the MMIC chips.
5. In some cases, after the completion of the ELO step, a backside process is performed. Then the supporting substrate is subjected to dicing. The resulting chips are mounted on IC cases.

Figure 1:
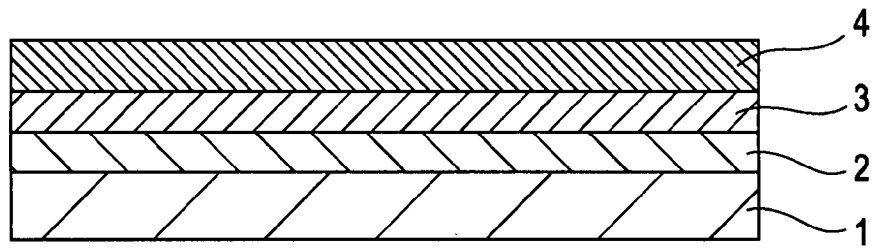
FIG. 1 is a schematic view (No. 1) illustrating an embodiment of the present invention.

An embodiment of the present invention will be described below on the basis of the drawings. As shown in FIG. 1, a sacrificial layer 2 composed of AlAs and having a thickness of about 2 nm is formed on a semiconductor substrate 1 composed of InP. A device-protecting layer 3 composed of InP is formed thereon. A device layer 4 is epitaxially grown on the device-protecting layer 3. The device layer 4 is formed so as to be lattice-matched to the semiconductor substrate 1. In this embodiment, the device layer 4 has a structure of n+InGaAs/n−InP/u−InGaAs/p+InGaAs/n−InP/n+InP/n+InGaAs in that order from the semiconductor substrate 1 side.

Figure 2:
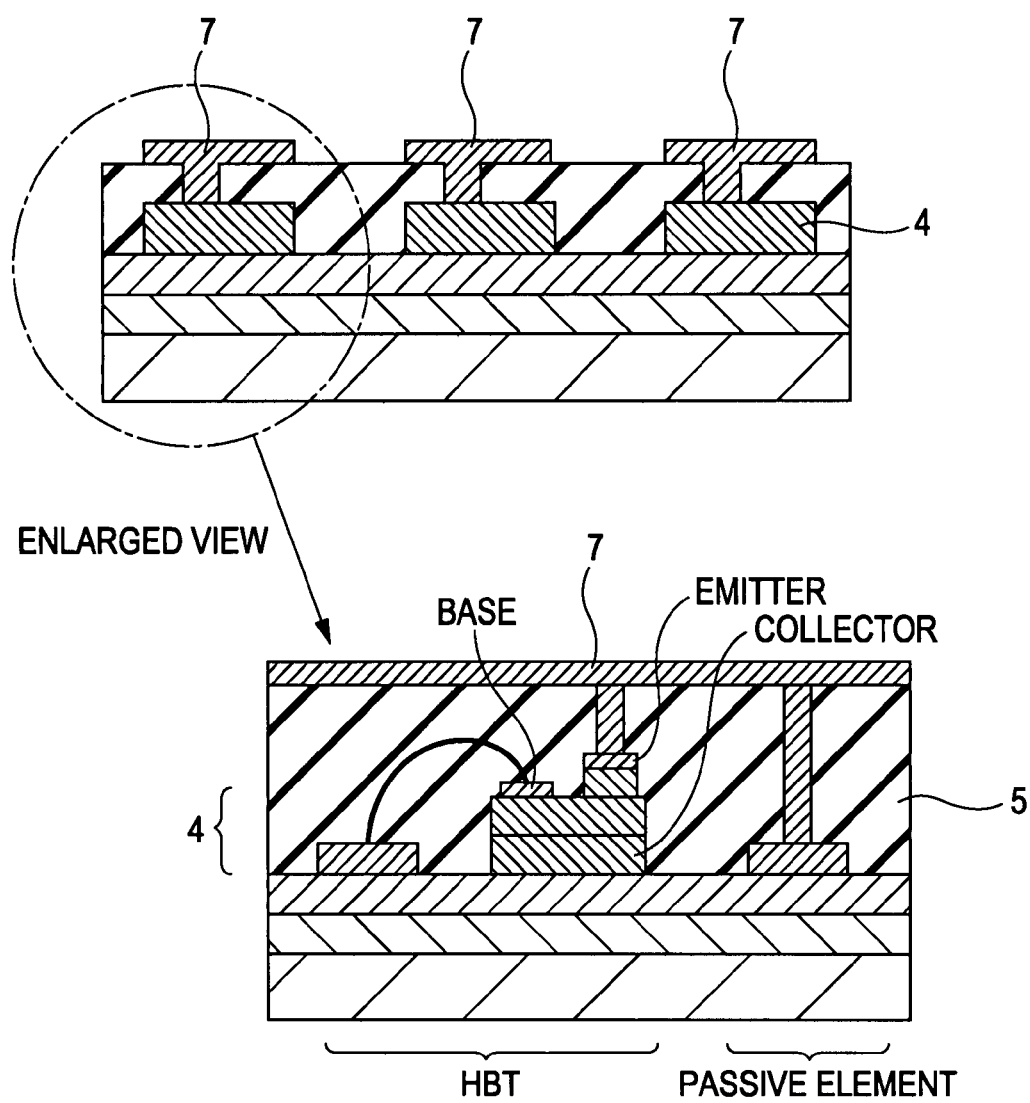
FIG. 2 is a schematic view (No. 2) illustrating an embodiment of the present invention.

As shown in FIG. 2, desired devices are formed by photolithography or the like in the epitaxially grown device layer 4. Hetero-junction bipolar transistors (HBTs) having emitters to be grounded are exemplified in FIG. 2.

An insulating film 5 composed of benzocyclobutene (BCB) and having a thickness of about 2 µm is formed around the HBTs. The insulating film 5 may also be an inorganic film, such as a $SiO_2$ film or a SiN film, formed by plasma-enhanced chemical vapor deposition (CVD) or an organic film such as a polyimide film. Preferably, the insulating film 5 is an organic coating film, such as a BCB film or a polyimide film, which can easily have a thickness of several micrometers. Passive elements are formed in plane with the HBTs. Ground vias are appropriately formed. Connection metal films 7 composed of Au or the like and communicating with the ground vias are formed on the surface of the insulating film 5.

Figure 3A:
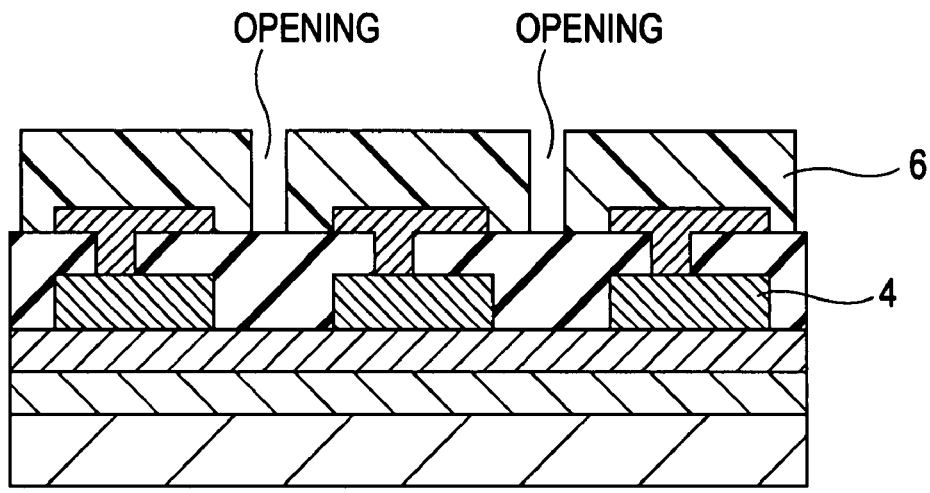
FIGS. 3A and 3B are each a schematic view (No. 3) illustrating an embodiment of the present invention.
Figure 3B:
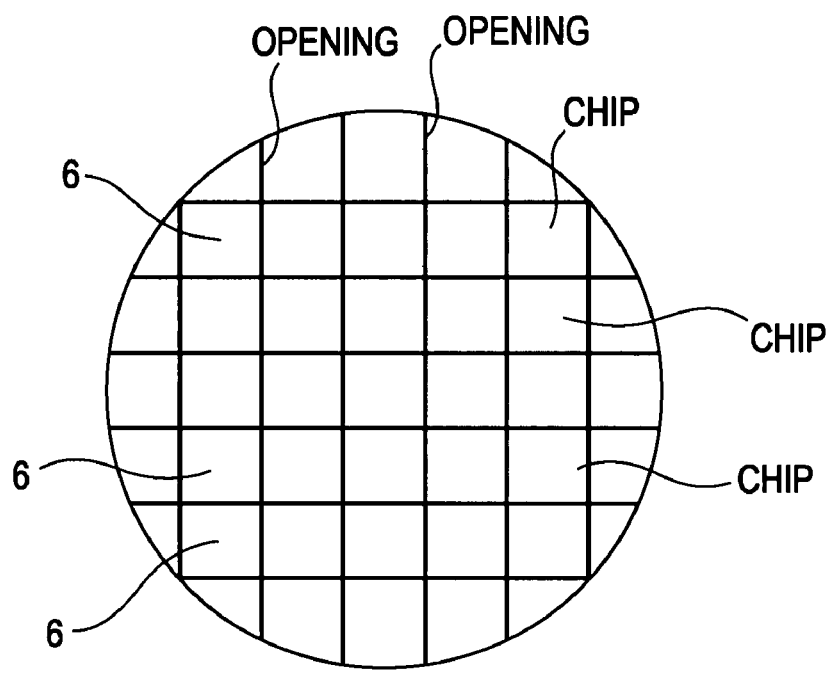

As shown in FIGS. 3A and 3B, a resist 6 is applied on the device layer. A grid pattern in response to the chip size is formed. That is, openings are formed by photolithography in portions of the resist 6 corresponding to peripheries of the chips.

Figure 4:
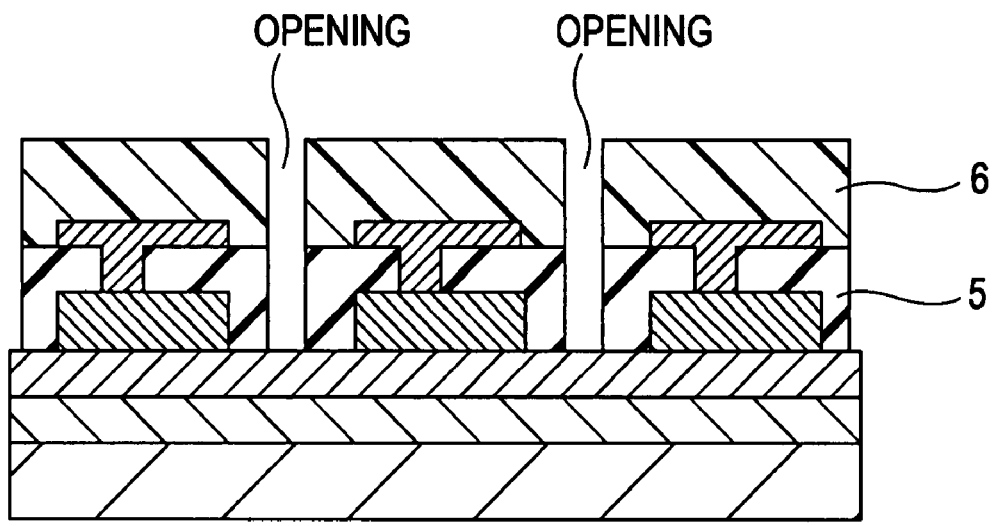
FIG. 4 is a schematic view (No. 4) illustrating an embodiment of the present invention.

As shown in FIG. 4, the insulating film 5 composed of BCB is etched by dry etching with a mixture gas of $CF_4/O_2$ through the openings in the resist 6 located on the device layer.

Figure 5:
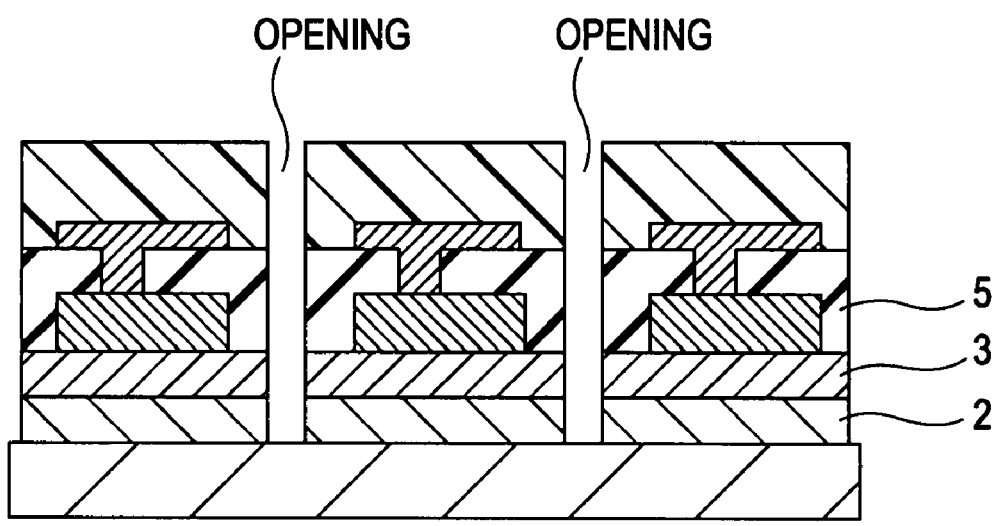
FIG. 5 is a schematic view (No. 5) illustrating an embodiment of the present invention.

As shown in FIG. 5, the device-protecting layer 3 and the sacrificial layer 2 are etched by wet etching with, for example, diluted hydrochloric acid, through openings formed by etching the insulating film 5, thereby forming grooves extending from the device layer 4 to the sacrificial layer 2 and in the form of a grid on the surface of the substrate. The device layer 4 is surrounded by the device-protecting layer 3 and the insulating film 5, and the device-protecting layer 3 is strongly bonded to the insulating film 5, thereby preventing the penetration of the etching solution to the device layer 4 during etching.

Figure 6A:
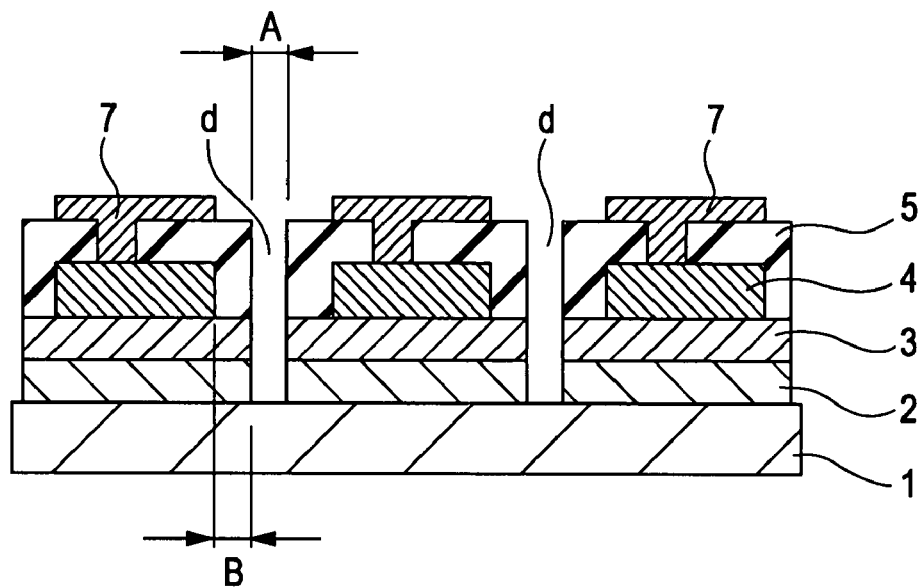
FIGS. 6A and 6B are each a schematic view (No. 6) illustrating an embodiment of the present invention.
Figure 6B:
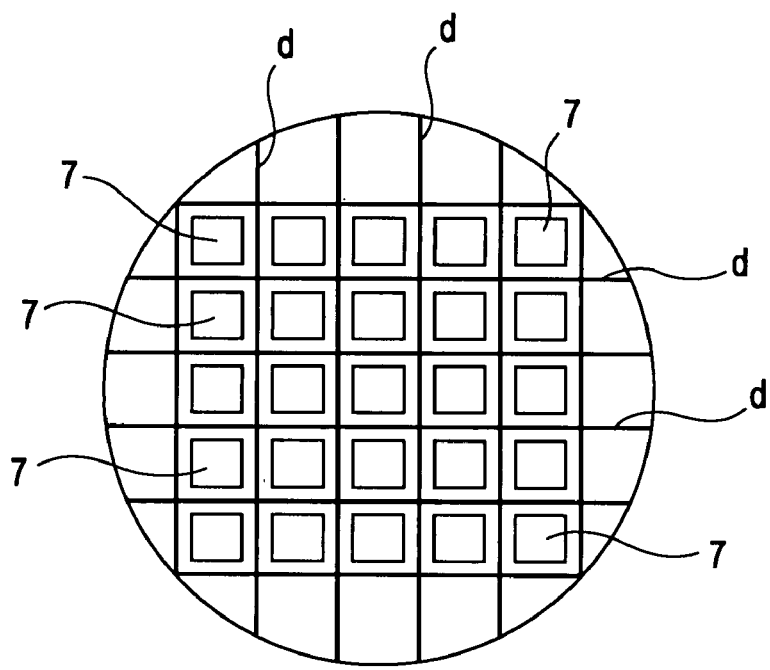

As shown in FIGS. 6A and 6B, the resist 6 shown in FIG. 5 is removed. The resulting grooves d are arranged along dicing lines that lie at the peripheries of the chips. The grooves each have a width A of about 100 µm. The grooves d lying along the dicing lines serve as reference lines during cutting in the subsequent dicing step. The distance B between the side face of each groove d and a corresponding one of the active regions of the devices is set at about 10 µm. A larger distance B is preferred from the viewpoint of the protection of the devices.

Figure 7A:
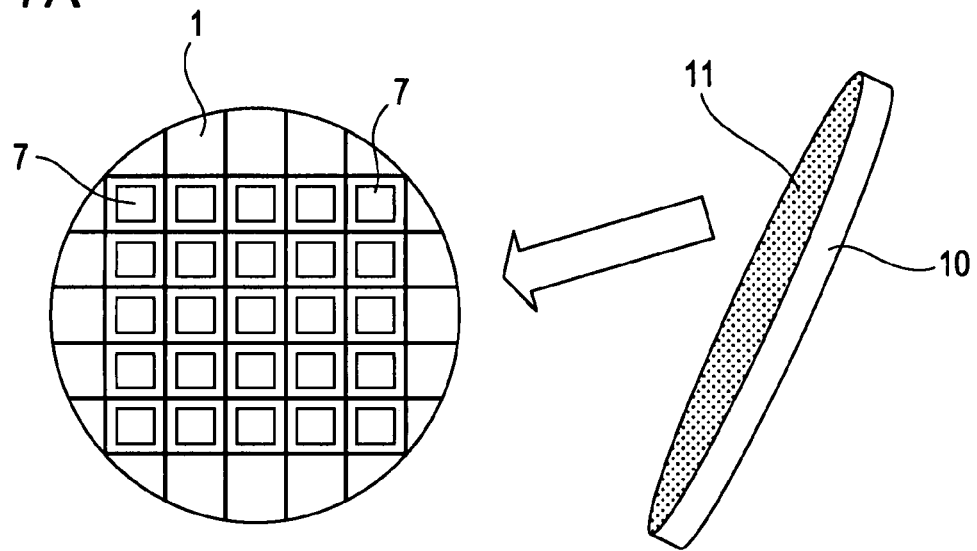
FIGS. 7A, 7B, and 7C are each a schematic view (No. 7) illustrating an embodiment of the present invention.
Figure 7B:
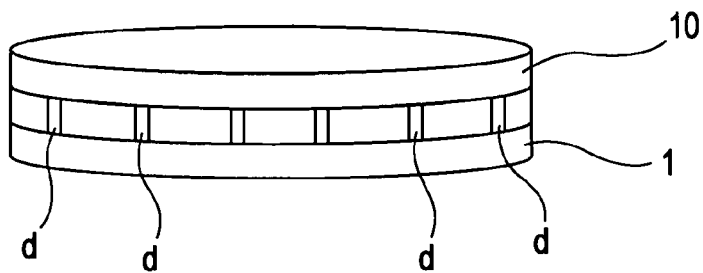
Figure 7C:
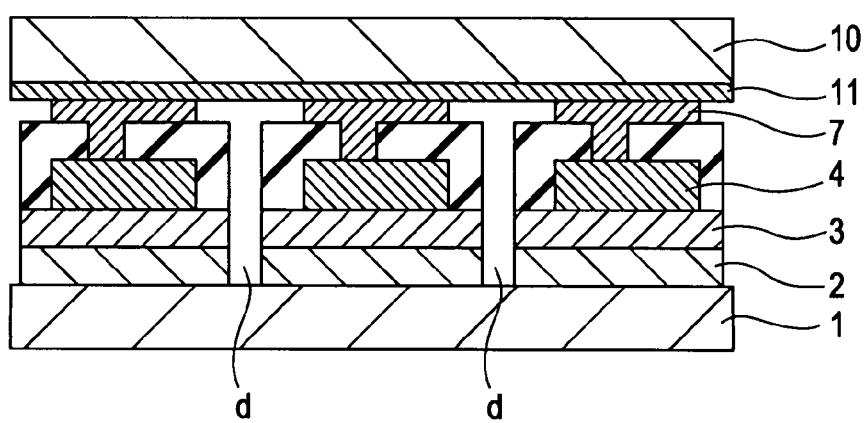

As shown in FIGS. 7A, 7B, and 7C, a supporting substrate 10 (composed of, for example, Cu or AlN) having a film 11 composed of Au and formed by evaporation on the entirety of a surface is bonded to the device layer 4 side of the semiconductor substrate 1. The connection metal film 7 composed of Au is formed on the device layer 4 side. Bonding the supporting substrate 10 connects the film 11 on the supporting substrate 10 to the connection metal film 7 disposed on the device layer 4. In this case, Au is used for connection. Alternatively, the connection may be established by heating with solder. Cu may also be used.

When the semiconductor substrate 1 is bonded to the supporting substrate 10, the grooves d formed in the device layer 4 appear as openings located at the periphery of the bonded substrate.

Figure 8:
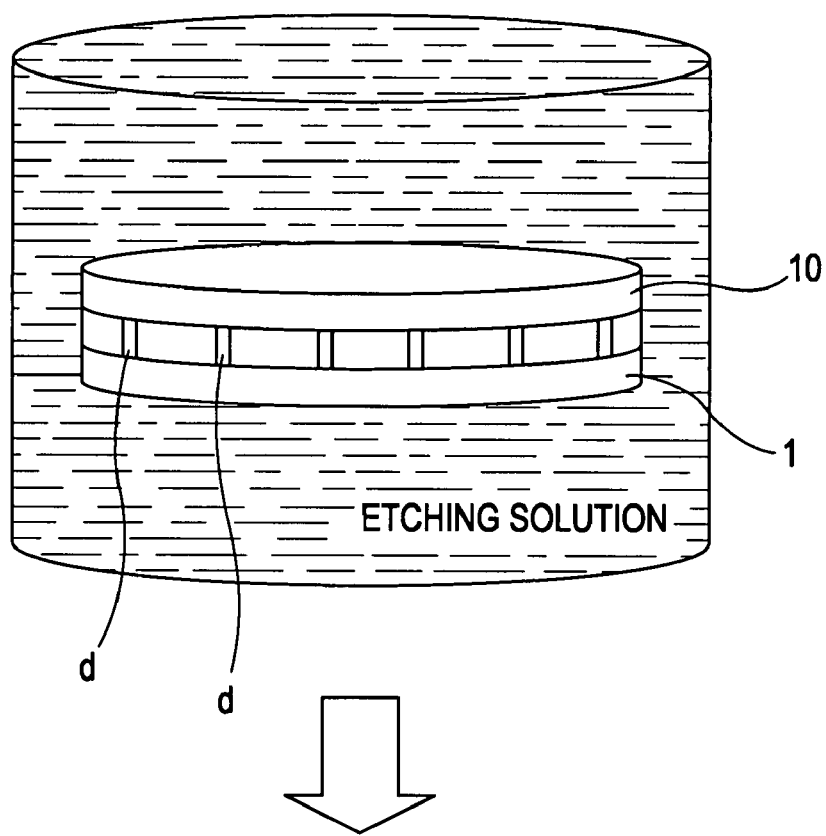
FIG. 8 is a schematic view (No. 8) illustrating an embodiment of the present invention.
Figure 8:
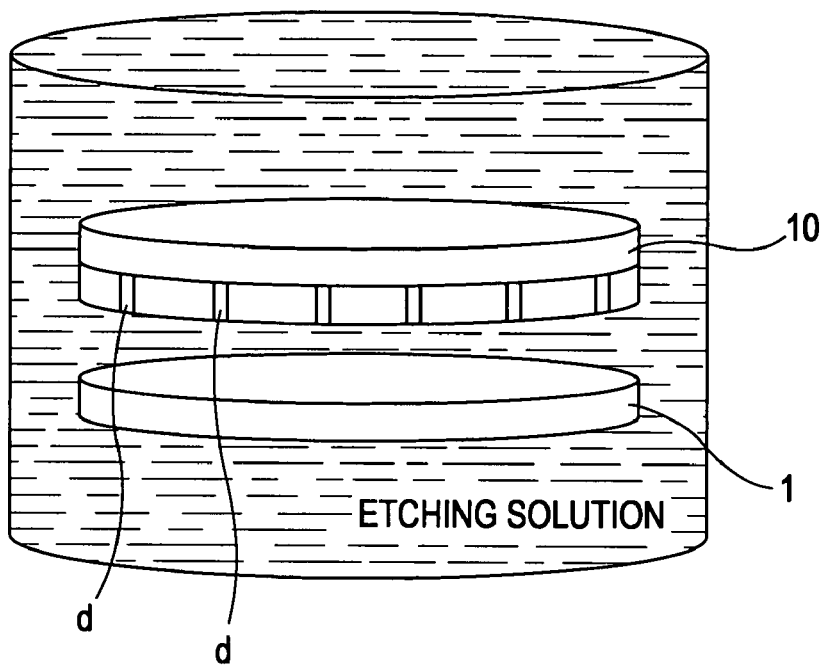

As shown in FIG. 8, the bonded substrate (obtained by bonding the semiconductor substrate 1 to the supporting substrate 10) formed in the prior step is immersed in a HF solution (etching solution). The HF solution has a concentration of, for example, 10% to 50%. The immersion of the bonded substrate in the HF solution results in the dissolution of the sacrificial layer 2, thereby separating the semiconductor substrate 1 from the supporting substrate 10 connected to the device layer 4.

The HF solution penetrates through the grooves d formed in the device layer 4. That is, the HF solution rapidly penetrates from the middle portion to the end portions of the bonded substrate through the grooves d in the form of a grid. The grooves d extend to the sacrificial layer 2. Thus, the HF solution penetrates to the sacrificial layer 2 in a small amount of time through the grooves d, resulting in the rapid separation of the substrate. The supporting substrate 10 may be slightly warped during the separation step.

Figure 9:
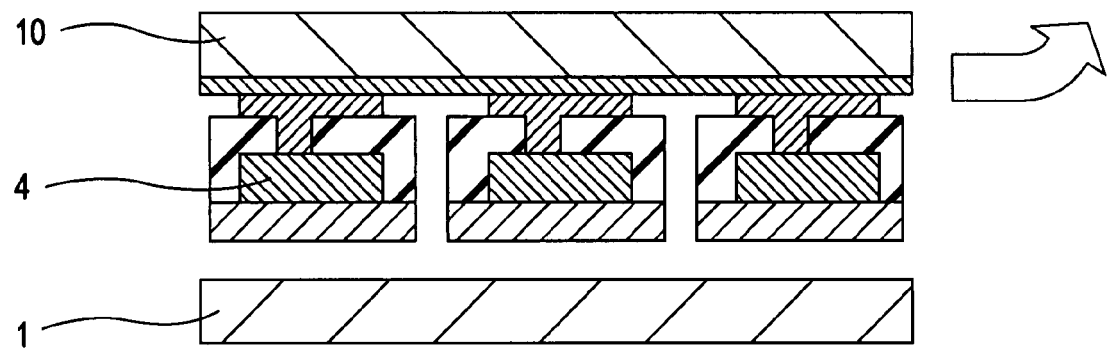
FIG. 9 is a schematic view (No. 9) illustrating an embodiment of the present invention.

As shown in FIG. 9, after the supporting substrate 10 connected to the device layer 4 is separated from the semiconductor substrate 1, the semiconductor substrate 1 is alone. Thus, the semiconductor substrate 1 can be reused after surface cleaning.

Figure 10A:
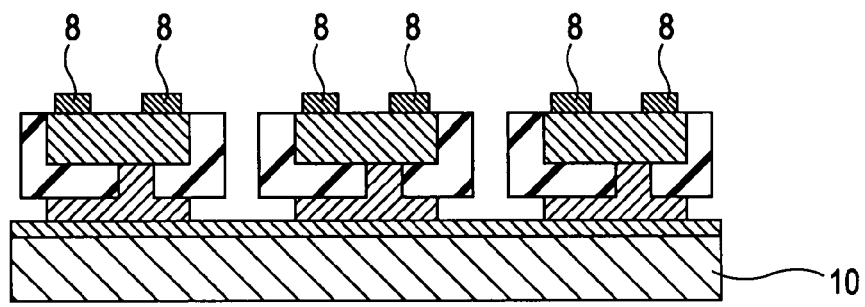
FIGS. 10A and 10B are each a schematic view (No. 10) illustrating an embodiment of the present invention.
Figure 10B:
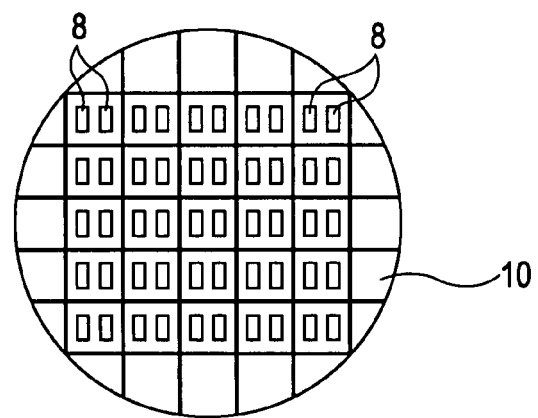

As shown in FIGS. 10A and 10B, the supporting substrate 10 is placed down. The devices are subjected to backside treatment, according to need, to form electrodes 8.

Figure 11:
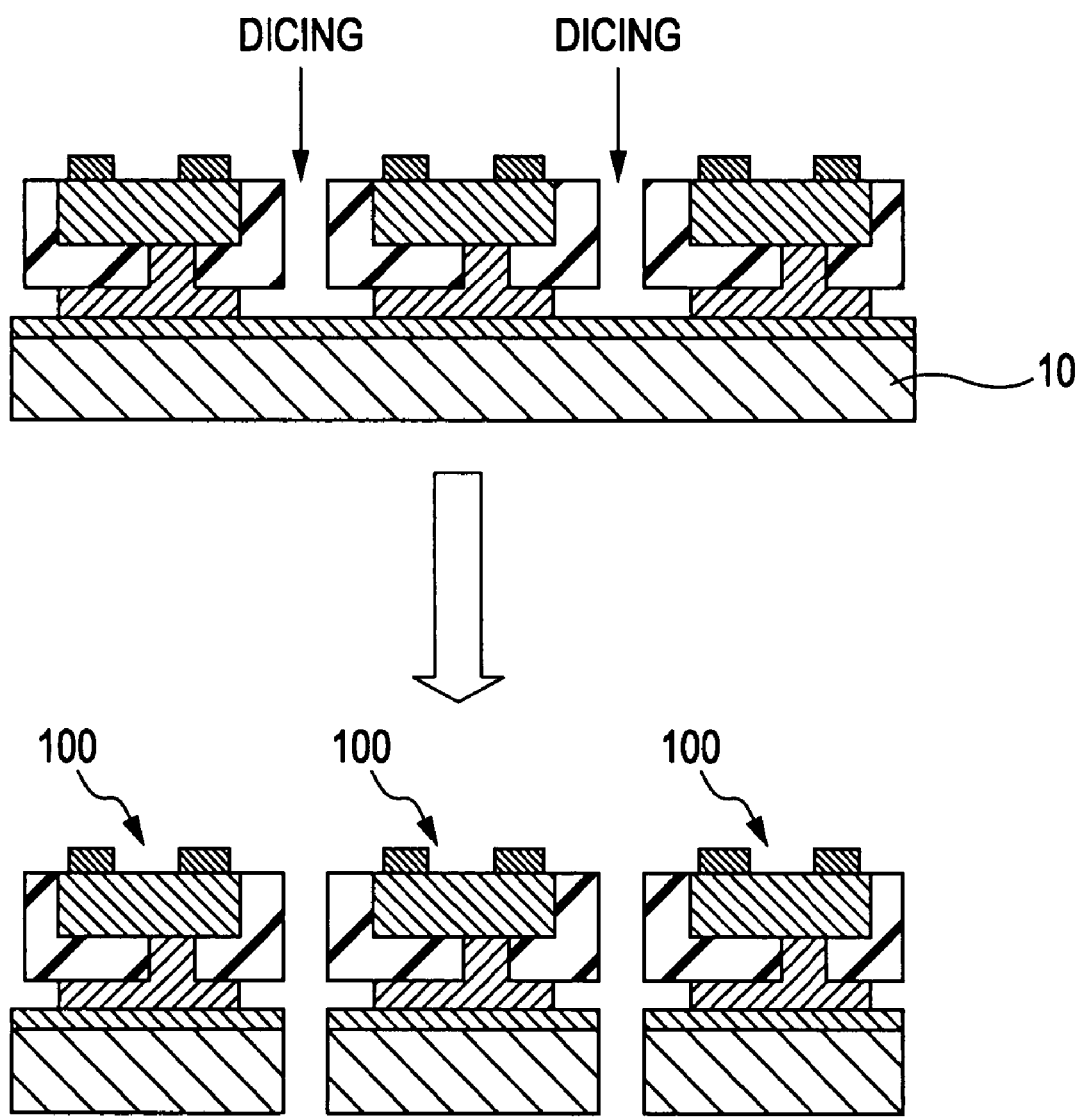
FIG. 11 is a schematic view (No. 11) illustrating an embodiment of the present invention.
Figure 12:
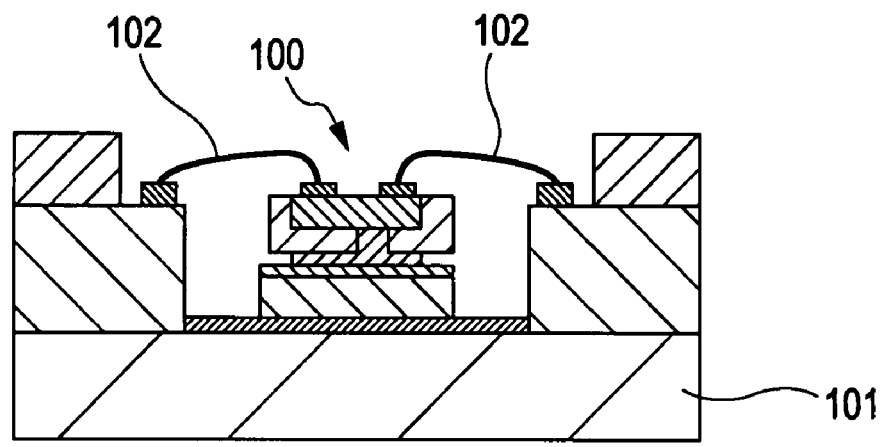
FIG. 12 is a schematic view (No. 12) illustrating an embodiment of the present invention.

As shown in FIG. 11, the devices (chips) on the supporting substrate 10 are subjected to dicing to form individual chips 100. As shown in FIG. 12, each of the chips 100 is mounted on a package 101, such as a low temperature co-fired ceramic package (LTCC). Interconnection is established with bonding wire 102 to complete semiconductor devices.

According to this embodiment, the grooves each extending from the device layer 4 to the sacrificial layer 2 are formed; hence, in separating the semiconductor substrate 1 from the device layer 4, the etching solution penetrates efficiently to the sacrificial layer 2 through the grooves and dissolves the sacrificial layer 2 in a small amount of time, thus separating the semiconductor substrate 1.

Figure 13:
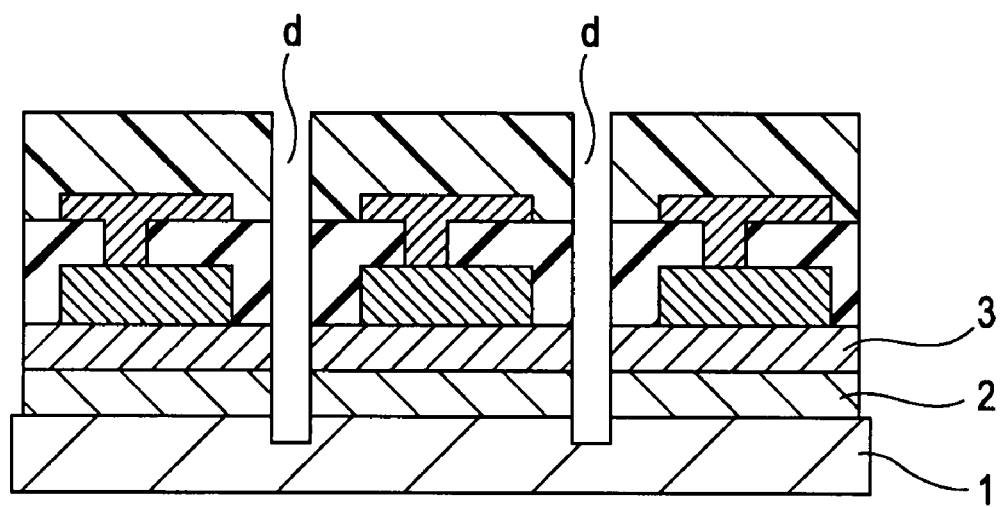
FIG. 13 is a schematic cross-sectional view of the case in which grooves formed by etching each have a depth deeper than planned.

From the viewpoint of the reuse of the semiconductor substrate 1 separated, wet etching performed in the final stage of the process of forming the grooves will be described. FIG. 13 is a schematic cross-sectional view of the case in which the grooves formed by wet etching each have a depth deeper than planned. That is, during the formation of the grooves d, the grooves are dug by etching from the device-protecting layer 3 to the sacrificial layer 2. In the case of the failure of controlling etching depth, the semiconductor substrate 1 is disadvantageously etched. If the semiconductor substrate 1 is etched, the semiconductor substrate 1 may not be reused unless irregularities of the surface are removed.

Figure 14:
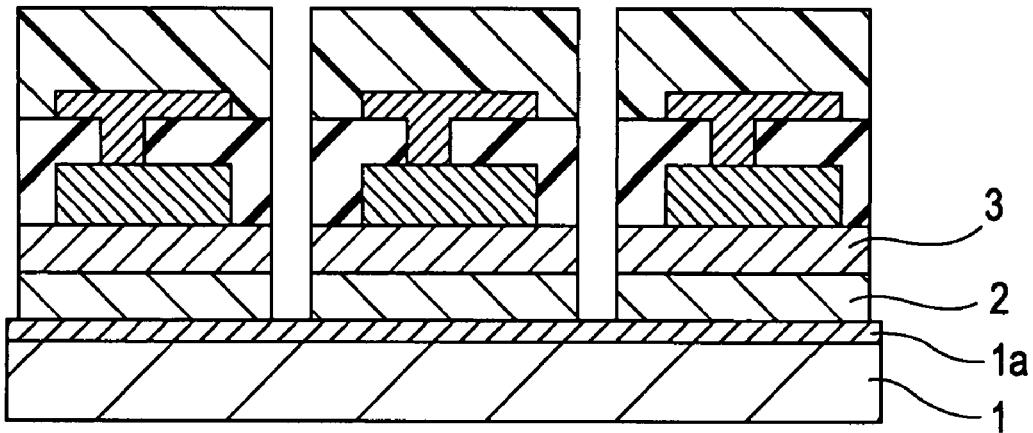
FIG. 14 is a schematic cross-sectional view (No. 1) illustrating a measure.

Therefore, in this embodiment, to prevent the semiconductor substrate 1 from being etched during the formation of the grooves, the following method is employed (see FIG. 14):
(1) The device-protecting layer 3 is composed of InGaAs.
(2) A stop layer 1a composed of InP is formed under the sacrificial layer 2.
(3) The device-protecting layer 3 and the sacrificial layer 2 are etched with a mixed solution of phosphoric acid and a hydrogen peroxide solution.

In this case, the stop layer 1a composed of InP disposed under the sacrificial layer 2 is not etched with the mixed solution of phosphoric acid and the hydrogen peroxide solution, thereby terminating the etching. Therefore, only the device-protecting layer 3 and the sacrificial layer 2 are etched, resulting in the prevention of etching the semiconductor substrate 1.

Figure 15:
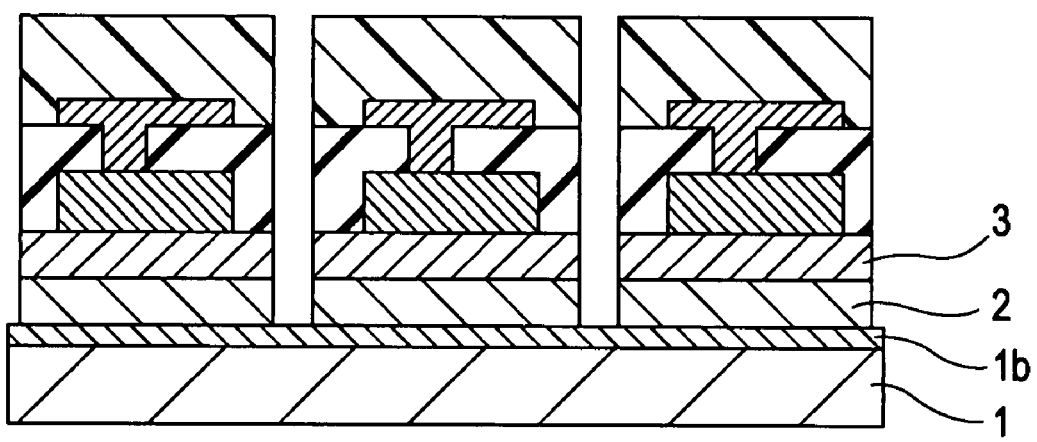
FIG. 15 is a schematic cross-sectional view (No. 2) illustrating a measure.

Another method will be described below (see FIG. 15);
(1) The device-protecting layer 3 is composed of InP.
(2) A mixed crystal layer 1b containing As, e.g., InGaAs or InAlAs, is formed under the sacrificial layer 2.
(3) The device-protecting layer 3 and the sacrificial layer 2 are etched with diluted hydrochloric acid.

In this case, the mixed crystal layer 1b containing As, e.g., InGaAs or InAlAs, disposed under the sacrificial layer 2 is not etched by diluted hydrochloric acid, thereby terminating the etching. Therefore, only the device-protecting layer 3 and the sacrificial layer 2 are etched, resulting in the prevention of etching the semiconductor substrate 1. When the mixed crystal layer 1b containing As, e.g., InGaAs or InAlAs, left on the surface of the separated semiconductor substrate 1 is dissolved with a phosphoric acid-based etching solution, a flat InP surface can be obtained and is reusable.

In the above-describe embodiment, the MMICs are exemplified as target semiconductor devices. The present invention is not limited thereto. The present invention is applicable to another semiconductor device. The composition of each layer is only an example and is not limited to this embodiment. The grooves are preferably in the form of a grid and arranged along the dicing lines between the chips. Alternatively, in order to allow the etching solution to penetrate to the sacrificial layer 2 through the grooves, the grooves may be formed in desired positions on the substrate. In this case, when the supporting substrate 10 larger than the semiconductor substrate 1 is bonded, the grooves need to communicate with ends of the semiconductor substrate 1. This prevents the occlusion of inlets of the grooves d for the etching solution by bonding the supporting substrate 10 to the semiconductor substrate 1.

In the above-described embodiment, with respect to the depth of the grooves d, the case of the grooves each extending from the device layer 4 to the bottom of the sacrificial layer 2 is described. Alternatively, each groove may extend from the device layer 4 to the middle of the thickness of the sacrificial layer 2. Each groove may extend from the device layer 4 to the surface of the sacrificial layer 2. That is, it is necessary to increase the contact area between the etching solution and the sacrificial layer 2 when the etching solution penetrates through the grooves d. Therefore, preferably, each groove extends from the device layer 4 to the middle of the thickness of the sacrificial layer 2. More preferably, each groove extends from the device layer 4 to the surface of the sacrificial layer 2. Most preferably, each groove extends from the device layer 4 to the bottom of the sacrificial layer 2, as described in the embodiment above.

In the above-described embodiment, the grooves are formed after the formation of the devices in the device layer 4. Alternatively, after the device layer 4 is grown, the grooves d may be formed before the devices are formed. In the case where the grooves are formed before the devices are formed, preferably, the grooves d are filled with an insulating material, or the inner walls of the grooves d are covered with insulating films, from the standpoint of the prevention of damage to the inside of the device layer 4 from the grooves d during the formation of the devices.

Figure 16A:
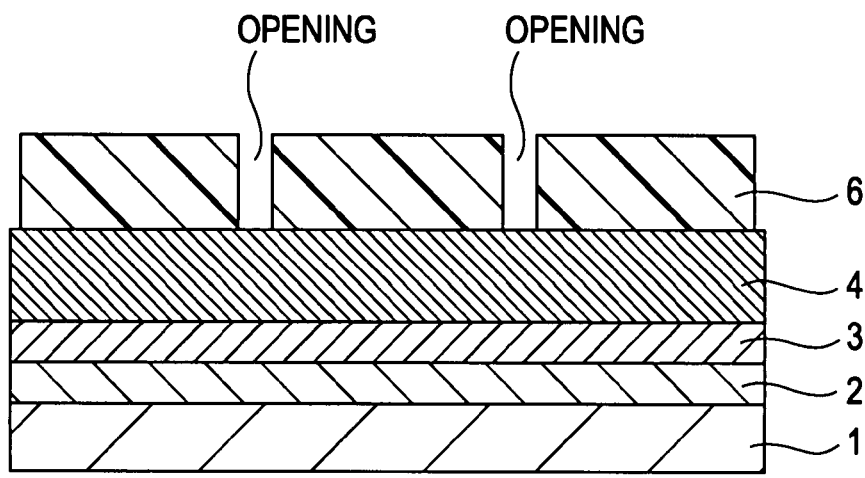
FIGS. 16A, 16B, and 16C are each a schematic cross-sectional view (No. 1) illustrating an example of a method of forming grooves before forming a device.

FIGS. 16A to 17C are each a schematic cross-sectional view illustrating an example of a method of forming the grooves before forming the devices. As shown in FIG. 16A, the sacrificial layer 2 composed of AlAs and having a thickness of about 2 nm is formed on the semiconductor substrate 1 composed of InP. The device-protecting layer 3 composed of InP is formed thereon. The device layer 4 is epitaxially grown on the device-protecting layer 3. The device layer 4 is lattice-matched to the semiconductor substrate 1. In this embodiment, the device layer 4 has a structure of n+InGaAs/ n−InP/u−InGaAs/p+InGaAs/n−InP/n+InP/n+InGaAs in that order from the semiconductor substrate 1 side. The resist 6 is applied to the device layer 4. A grid pattern in response to the chip size is formed. That is, openings are formed by photolithography in portions of the resist 6 corresponding to peripheries of the chips.

Figure 16B:
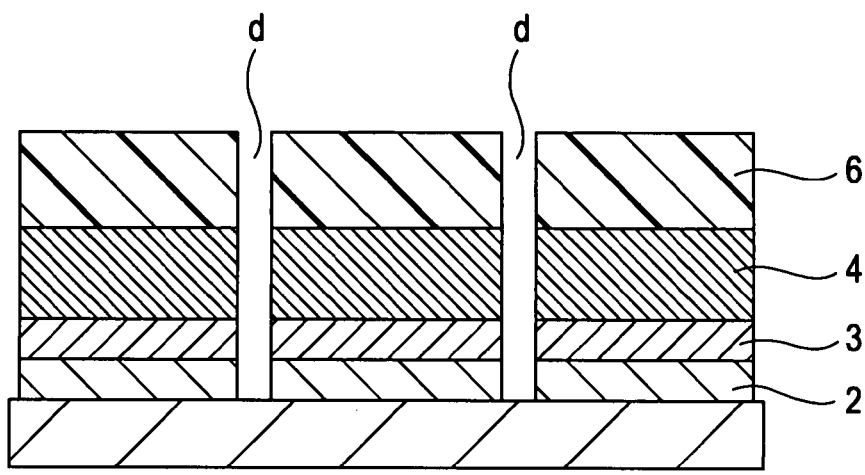

As shown in FIG. 16B, the grooves d are formed by wet etching with, for example, diluted hydrochloric acid, through the openings formed in the resist 6. The grooves d are formed in the form of a grid on the surface of the substrate so as to extend to the sacrificial layer 2 through the device layer 4 and the device-protecting layer 3.

Figure 16C:
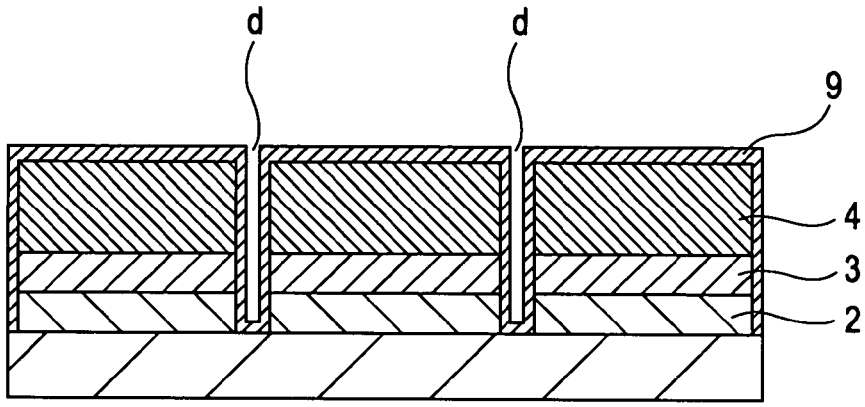

After the resist 6 is detached, as shown in FIG. 16C, a silicon oxide film 9 is deposited by, for example, plasma-enhanced CVD so as to cover surfaces of the grooves d. This prevents the exposure of the device layer 4 at the grooves d. A material that can be dissolved in the etching solution used in etching the sacrificial layer 2 in the subsequent step should be used as the material of the film deposited.

Figure 17A:
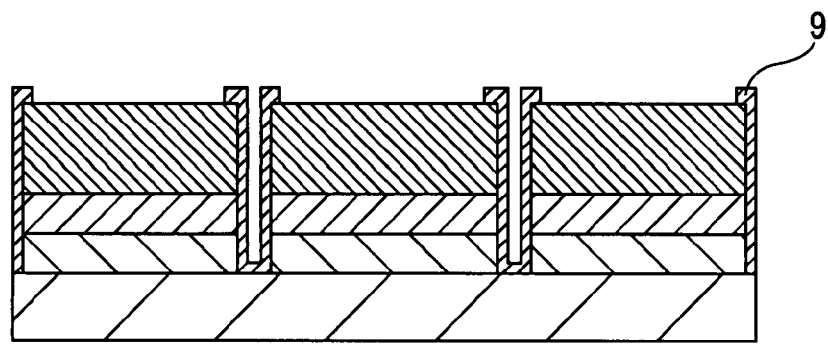
FIGS. 17A, 17B, and 17C are each a schematic cross-sectional view (No. 2) illustrating an example of a method of forming grooves before forming a device.
Figure 17B:
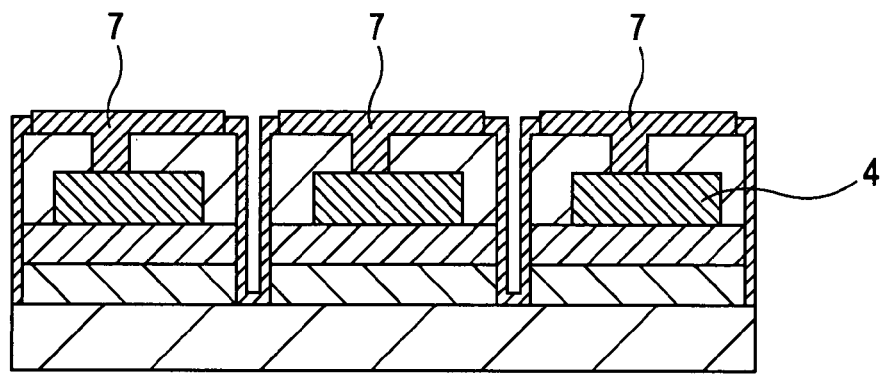
Figure 17C:
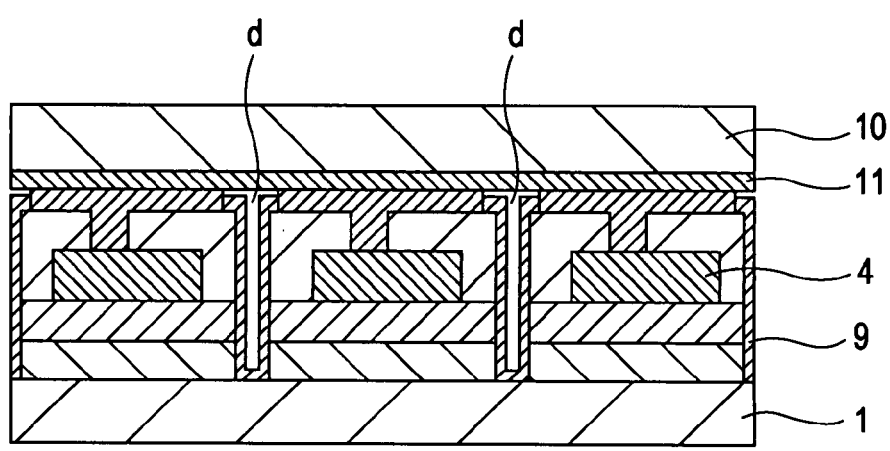

As shown in FIG. 17A, portions of the silicon oxide film 9 corresponding to top faces of the chips are removed by reactive ion etching (RIE) to form openings. Then a common device processing is performed. As shown in FIG. 17B, devices are formed in the device layer 4. The connection metal film 7 is formed on the surface of each chip. As shown in FIG. 17C, the supporting substrate 10 (composed of, for example, Cu or AlN) having the film 11 composed of Au and formed by evaporation on the entirety of a surface is bonded to the device layer 4 side of the semiconductor substrate 1.

The subsequent steps are equal to the steps shown in FIGS. 8 to 12. The HF solution (etching solution) penetrates to the sacrificial layer 2 through the grooves d, thus rapidly separating the substrate. Also, the silicon oxide film 9 disappears during etching.

Figure 18A:
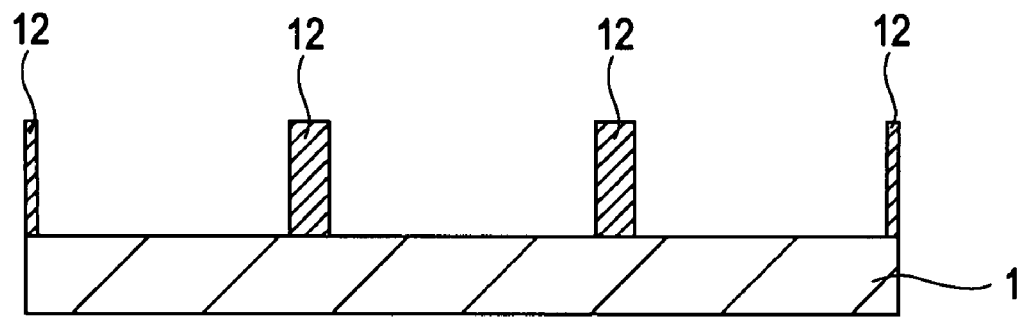
FIGS. 18A and 18B are each a schematic cross-sectional view (No. 1) illustrating another example of a method of forming grooves before forming a device.

FIGS. 18A to 19B are each a schematic cross-sectional view illustrating another example of a method of forming the grooves before forming the devices. As shown in FIG. 18A, silicon oxide films 12 having a striped pattern are formed at portions corresponding to peripheries of chips on the semiconductor substrate 1 composed of InP. A material that can be dissolved in the etching solution used in etching the sacrificial layer in the subsequent step should be used as the material of the film formed.

Figure 18B:
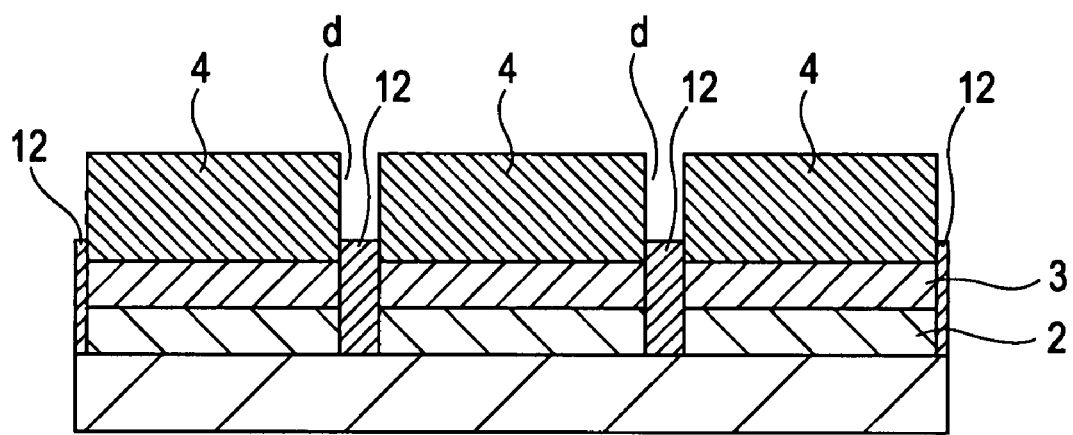

As shown in FIG. 18B, the sacrificial layers 2 having a thickness of about 2 nm and composed of AlAs are formed between the silicon oxide films 12 on the semiconductor substrate 1. The device-protecting layers 3 composed of InP are formed thereon. The device layers 4 are epitaxially grown on the device-protecting layers 3. The device layers 4 are lattice-matched to the semiconductor substrate 1. In this embodiment, the device layer 4 has a structure of n+InGaAs/ n-InP/u-InGaAs/p+InGaAs/n-InP/n+InP/n+InGaAs in that order from the semiconductor substrate 1 side. The device layers 4 and the silicon oxide films 12 constitute grooves d.

Figure 19A:
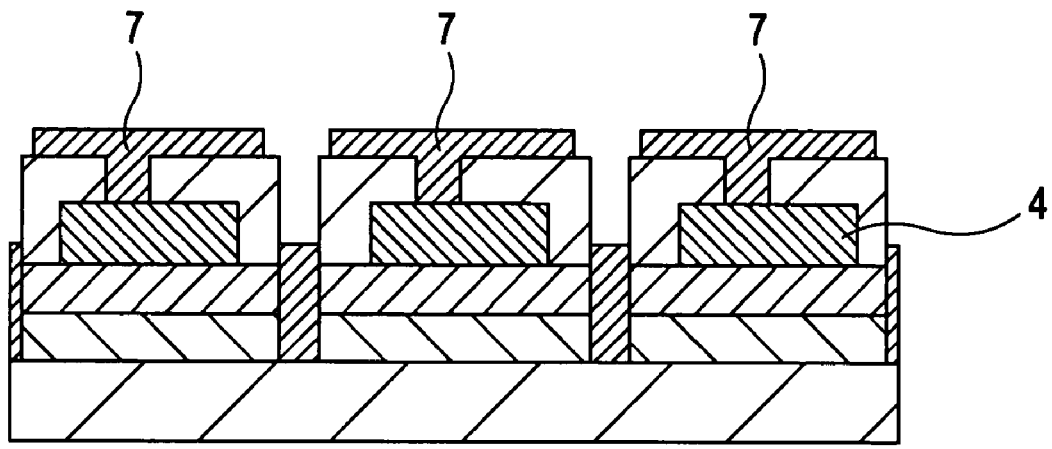
FIGS. 19A and 19B are each a schematic cross-sectional view (No. 2) illustrating another example of a method of forming grooves before forming a device.
Figure 19B:
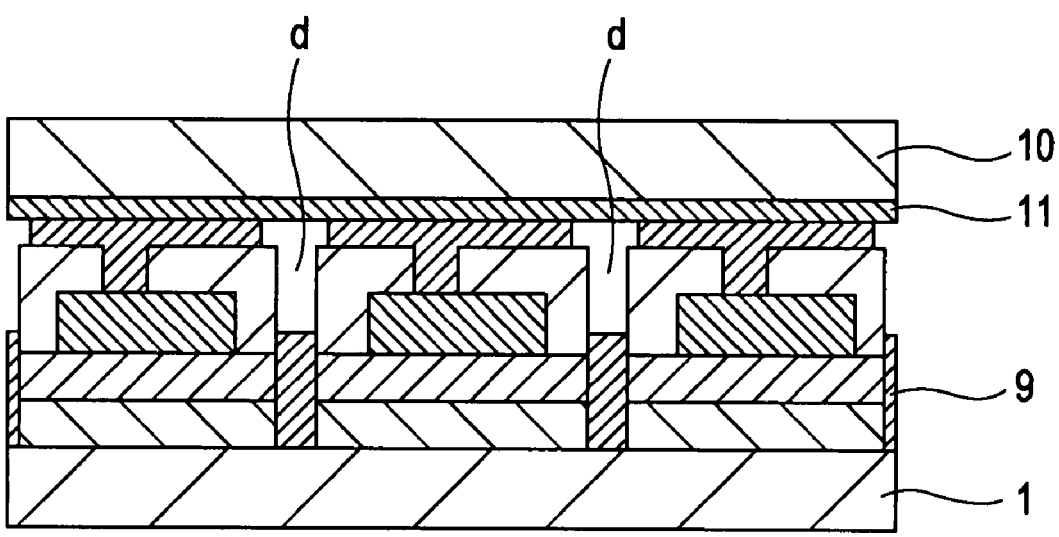

As shown in FIG. 19A, devices are formed in the device layers 4. The connection metal films 7 are formed on the surfaces of the chips. As shown in FIG. 19B, the supporting substrate 10 (composed of, for example, Cu or AlN) having the film 11 composed of Au and formed by evaporation on the entirety of a surface is bonded to the device layer 4 side of the semiconductor substrate.

The subsequent steps are equal to the steps shown in FIGS. 8 to 12. The HF solution (etching solution) penetrates to the sacrificial layers 2 through the grooves d, thus rapidly separating the substrate. Also, the silicon oxide films 12 disappear during etching.

In this embodiment, the method forming the grooves d before forming the devices in the device layer 4 and forming the devices after forming the grooves d may be employed.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a semiconductor device, comprising the steps of:
    forming a predetermined device in a device layer grown on a semiconductor substrate with a sacrificial layer provided therebetween; and
    removing the sacrificial layer by etching to separate the semiconductor substrate from the device layer while a supporting substrate is bonded to the side of the device layer,
    wherein in the step of removing the sacrificial layer, a groove extending from the device layer to the sacrificial layer is formed before the sacrificial layer is removed, and
    the etching solution is allowed to penetrate to the sacrificial layer through the groove; and further wherein a film is formed at side walls of the groove to protect the device layer from the etching material.

2. A method for producing a semiconductor device, comprising the steps of:
    forming devices corresponding to a plurality of chips in a device layer grown on a semiconductor substrate with a sacrificial layer provided between the device layer and the semiconductor substrate;
    forming grooves each located between adjacent chips, each of the grooves extending from the device layer to the sacrificial layer;
    wherein a film is formed at side walls of the grooves to protect the device layer from etching material;
    bonding a supporting substrate to the side of the device layer;
    removing the sacrificial layer by allowing the etching solution to penetrate to the sacrificial layer through the grooves to separate the semiconductor substrate from the device layer; and
    dividing the supporting substrate into pieces each corresponding to a corresponding one of the plurality of chips to form individual chips.

3. The method for producing a semiconductor device according to claim 2,
    wherein the grooves are in the form of a grid, each of the grooves being located between adjacent chips.

4. The method for producing a semiconductor device according to claim 2, further comprising a step of:
    forming a device-protecting layer between the sacrificial layer and the device layer, the device-protecting layer protecting the devices from an etching solution used in forming the grooves extending from the device layer to the sacrificial layer.

5. The method for producing a semiconductor device according to claim 2, further comprising a step of:
    forming a substrate-protecting film located between the semiconductor substrate and the sacrificial layer, the substrate-protecting film being insoluble in an etching solution used in forming the grooves.

6. The method for producing a semiconductor device according to claim 2,
    wherein the semiconductor substrate is a compound semiconductor substrate.

7. The method for producing a semiconductor device according to claim 2,
    wherein the semiconductor substrate is a InP substrate.

8. The method for producing a semiconductor device according to claim 2,
    wherein the semiconductor substrate is a GaAs substrate.

9. The method for producing a semiconductor device according to claim 2,
    wherein the sacrificial layer is composed of AlAs.

10. The method for producing a semiconductor device according to claim 2,
    wherein the sacrificial layer is composed of AlAsSb.

* * * * *